United States Patent
Kimura et al.

(10) Patent No.: US 6,626,994 B1
(45) Date of Patent: Sep. 30, 2003

(54) SILICON WAFER FOR EPITAXIAL WAFER, EPITAXIAL WAFER, AND METHOD OF MANUFACTURE THEREOF

(75) Inventors: Akihiro Kimura, Gunma (JP); Hideki Sato, Gunma (JP); Ryuji Kono, Gunma (JP); Masahiro Kato, Gunma (JP); Masaro Tamatsuka, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/890,007

(22) PCT Filed: Nov. 21, 2000

(86) PCT No.: PCT/JP00/08204

§ 371 (c)(1),
(2), (4) Date: Jul. 24, 2001

(87) PCT Pub. No.: WO01/38611

PCT Pub. Date: May 31, 2001

(30) Foreign Application Priority Data

Nov. 25, 1999 (JP) .......................................... 11-334040

(51) Int. Cl.[7] .............................................. C30B 25/00
(52) U.S. Cl. ............................ 117/84; 117/13; 117/19; 117/20; 117/84
(58) Field of Search ............................ 117/13, 19, 20, 117/84

(56) References Cited

FOREIGN PATENT DOCUMENTS

JP        2000-203999        7/2000

OTHER PUBLICATIONS

Masaro Tamatsuka et al., "High performance silicon wafer with wide grown–in void free zone and high density internal gettering site achieved via rapid crystal growth with nitrogen doping and high temperature hydrogen and/or argon annealing", Electrinic Society Proceedings vol. 99–1, pp. 456–467.

Masataka Kimura et al., "Behavior of COP Pits during Si Epitaxial Growth", Journal of the Japanese Association for Crystal Growth 24 (1997) 444.

M. Iwabuchi et al., "Relationship between stacking fault on epitaxial wager and particle on substrate", the Japanese Society of Applied Physics and Related Societies, 28a–Pb–1, p. 769.

W. Ohashi et al., "Nitrogen doping grown–in defects engineering in Czochralski silicon crystal", Kazusa akademia park forum on the science and technology on silicon materials 1999, pp. 80–104.

*Primary Examiner*—Felisa Hiteshew
(74) *Attorney, Agent, or Firm*—Hogan & Hartson, LLP

(57) ABSTRACT

There are provided a silicon wafer for epitaxial growth wherein a void type defect is not exposed on the surface where an epitaxial layer is grown, and a method for producing an epitaxial wafer comprising measuring the number of the void type defects exposed on the surface of a silicon wafer and/or the number of the void type defects which exist in the part to the depth of at least 10 nm from the surface of the silicon wafer, choosing the silicon wafer wherein the number of these void type defects is smaller than the predetermined value, and growing an epitaxial layer on the surface of the chosen silicon wafer. Thereby, there can be provided a silicon wafer for epitaxial growth wherein generation of SF is reduced and epitaxial wafer, and a method for producing it.

16 Claims, 8 Drawing Sheets

100nm

100nm

SILICON WAFER FOR EPITAXIAL WAFER, EPITAXIAL WAFER, AND METHOD OF MANUFACTURE THEREOF

CROSS-REFERENCE TO RELATED APPLICATION

None

STATEMENT REGARDING FEDERALLY SPONSORED RESEARCH OR DEVELOPMENT

Not Applicable.

INCORPORATION-BY-REFERENCE-OF MATERIALS SUBMITTED ON A COMPACT DISC

Not Applicable

BACKGROUND OF THE INVENTION (1) Field of the Invention

The present invention relates to a substrate for an epitaxial wafer wherein few crystal defects exist in an epitaxial layer compared with the conventional epitaxial wafers, an epitaxial wafer, and a method for producing it.

(2) Description of Related Art Including Information Disclosed under 37 C.F.R. 1.97 and 1.98.

Reduction of crystal defects in a semiconductor, especially the crystal defects on or near the surface, is getting more important with a recent tendency to increase the degree of integration of a semiconductor device. For this reason, the demand for an epitaxial wafer which has an epitaxial layer (hereinafter referred to as "epi-layer") excellent in crystallinity is increasing year by year.

Meanwhile, various crystal defects exist also in an epitaxial wafer, which have a harmful effect on a device, resulting in reduction in the yield. Therefore, it is necessary to reduce them.

There is a report that crystal defects in a polycrystalline epitaxial layer are generated from particles, which had adhered to the surface of the silicon wafer for epitaxial growth (hereinafter referred to as "substrate" occasionally) on which an epitaxial layer is formed (For example, Iwabuchi et al., Extended Abstracts (The 45th Spring Meeting, 1998); The Japan Society of Applied Physics and Related Societies, 28a-PB-1). Namely, it is necessary to perform epitaxial growth (hereinafter referred to as "epi-growth" occasionally), after removing the particles on a substrate, in order to prevent a part of the epitaxial layer from getting polycrystal.

A void type defect (hereinafter referred to as "voids" occasionally) exposed on the substrate surface is a vacancy cluster in the grown-in defect mainly introduced when growing a silicon single crystal that is exposed to the wafer surface. It has been considered that the voids may be a shallow pit after epi-growth, but they do not become crystal defects (Kimura et al., Journal of the Japanese Association for Crystal Growth 24 (1997) 444). The cause of generation of the defects in the epitaxial layer called an epitaxial stacking fault (hereinafter referred to as "SF") is not clear by present, and a method for reducing them has not been found.

BRIEF SUMMARY OF THE INVENTION

The present invention has been accomplished to solve the above-mentioned problems. An object of the present invention is to provide a silicon wafer for epitaxial growth, an epitaxial wafer, and a method for producing it wherein generation of SF is reduced.

In order to solve the above-mentioned problems, the present invention relates to a silicon wafer for epitaxial growth wherein a void type defect is not exposed at least on a surface where an epitaxial layer is grown.

As described above, if a void type defect is not exposed at least on a surface where an epitaxial layer is grown, generation of SF during epitaxial growth can be prevented in the silicon wafer for epitaxial growth. Since it is clear that SF is generated from the void type defect, SF can be prevented from generating in an epi-layer by using a wafer that does not contain such a void type defect as a substrate for an epitaxial wafer.

In addition, in a usual epitaxial process, hydrogen baking is performed just before growing an epitaxial layer, and the substrate surface is etched to some extent. Therefore, "the surface where an epitaxial layer is grown" in the present invention substantially means the surface of the substrate just before an epitaxial layer is grown after the hydrogen baking (the boundary surface between an epitaxial layer and a substrate).

In this case, it is desirable that the above-mentioned void type defect does not exist in the part to the depth of at least 10 nm from the surface on which an epitaxial layer is grown.

Even if the void type defect is not exposed on the surface just before an epi-layer is grown, SF may be generated in the case that the void type defects exist in the part to the depth of 10 nm from the surface.

Moreover, it is desirable that nitrogen is doped in the above-mentioned silicon wafer for epitaxial growth.

Because, if the substrate in which nitrogen is doped is used, the nuclei of oxygen precipitation in the bulk part of a substrate will not disappear for the effect of nitrogen, even in the case that high temperature epitaxial growth is performed, and therefore gettering sites are formed in a subsequent device process, so that highly efficient epitaxial wafer can be obtained.

If the epitaxial layer is formed on the surface of the silicon wafer for epitaxial growth of the above-mentioned present invention, an epitaxial wafer of high quality wherein there is no SF or very few SF compared with the conventional one in the epitaxial layer can be obtained.

Moreover, the present invention relates to a method for producing an epitaxial wafer comprising measuring the number of the void type defects exposed on the surface of a silicon wafer and/or the number of the void type defects which exist in the part to the depth of at least 10 nm from the surface of the silicon wafer, choosing the silicon wafer wherein the number of these void type defects is smaller than the predetermined value, and growing an epitaxial layer on the surface of the chosen silicon wafer.

For example, the present invention relates to a method for producing an epitaxial wafer comprising taking one or more wafers from wafers in one manufacture lot, measuring the number of void type defects exposed to the surface of the wafer and/or the number of void type defects existing in the part to the depth of at least 10 nm from the surface of the wafer, choosing the silicon wafer wherein the void type defects are less than the predetermined values, namely the wafer with which are satisfied the number of the void type defects predetermined so as to be permitted from the specification (maximum value of the number of SF) of an epitaxial wafer required by a user, and growing an epitaxial layer thereon.

Thereby, a failure rate of the wafer can be reduced in manufacture of an epitaxial wafer, and feed back to the condition for production of a silicon single crystal wafer suitable for the epitaxial wafers according to user specification is made possible.

Moreover, the present invention relates to a method for producing an epitaxial wafer wherein a silicon wafer having void type defects exposed to the surface and/or void type defects in the part to the depth of at least 10 nm from the surface is subjected to heat treatment so that the above-mentioned void type defects may be eliminated and/or made into a form that does not become a generation source of SF, and an epitaxial layer is grown on the above-mentioned silicon wafer surface.

As described above, even in the wafer wherein the void type defects exist on or near the surface and SF will be generated when epitaxial growth is performed, if the voids on or near the surface are eliminated or made change to the form which does not generate SF by heat-treatment before epitaxial growth and an epitaxial layer is grown, an epitaxial wafer having high quality can be obtained. Thereby, the epitaxial wafer which does not generate SF during epitaxial growth can be obtained irrespective of the condition for production of a silicon single crystal wafer.

In this case, it is preferable that heat treatment is conducted at a temperature of 1100–1300° C. in non-oxidizing atmosphere as the above-mentioned heat treatment, and then, heat treatment at a temperature of 700–1300° C. in oxidizing atmosphere is continuously conducted, without cooling to a temperature less than 700° C.

If heat treatment is conducted in such a heat treatment condition, out-diffusion of the natural oxide film on the surface of a wafer and the oxide film of an inner wall of voids near the surface can be achieved by the first heat treatment in a non-oxidizing atmosphere, and thus in the subsequent heat treatment in an oxidizing atmosphere, the interstitial silicon can be injected efficiently and voids near the surface can be eliminated. As for voids exposed on the surface, a shape of opening can be smoothed by formation of an oxide film, and they can be prevented from being a generation source of SF in the subsequent epitaxial growth.

Moreover, since temperature is not lowered to less than 700° C. after the first heat treatment, the inner wall oxide film which hinders injecting of interstitial silicon to voids can be prevented from being grown again.

Moreover, the above-mentioned heat treatment can also be performed with introducing inert gas after hydrogen baking before growing an epitaxial layer in an epitaxial process.

If it is performed as above, heat treatment can be incorporated into the same epitaxial process using epitaxial growth equipment, so that it is very efficient.

Furthermore, it is desirable that a nitrogen doped silicon wafer is used as the above-mentioned silicon wafer.

As described above, if a nitrogen doped wafer is used, high gettering effect can be achieved by the effect of nitrogen.

As explained above, according to the present invention, the epitaxial wafer wherein generation of SF is reduced can be produced, and the device yield can be significantly improved.

DETAILED DESCRIPTION OF THE INVENTION

The embodiment of the present invention will be further described below with referring to the figures, but is not limited thereto.

The inventors of the present invention conducted the following experiments, in order to clarify the. cause of generation of SF in an epitaxial layer, and thereby completed the present invention.

Experiment 1

Case That a Nitrogen Non-doped Wafer is Used as a Substrate for Epitaxial Growth.

About 4 $\mu$m epitaxial layer was formed on CZ silicon single crystal wafer (a crystal axis orientation <100>, p type, 10 $\Omega$cm, oxygen concentration 14.7 ppma (JEIDA standard)) with a diameter of 8 inches grown at a usual pulling rate (about 1 mm/min) to produce four epitaxial wafers, which were then subjected to preferential etching. LPDs (Light Point Defect) on the surface of the epitaxial wafers detected with the surface inspection equipment (manufactured by KLA-Tencor Corporation, Surf Scan 6200) wherein laser light is used were observed with an optical microscope. The average number of SF on the surface of the epitaxial layer was about 2 number/8 inch wafer.

Figure 1A:
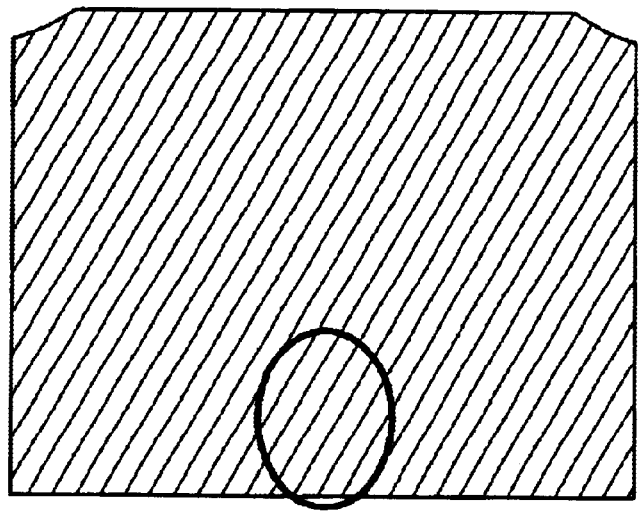
FIG. 1 is a view showing cross-sectional TEM observation, (a) is a microscope observation view and (b) is a schematic view showing the defects based on the microscope observation view.
Figure 1B:
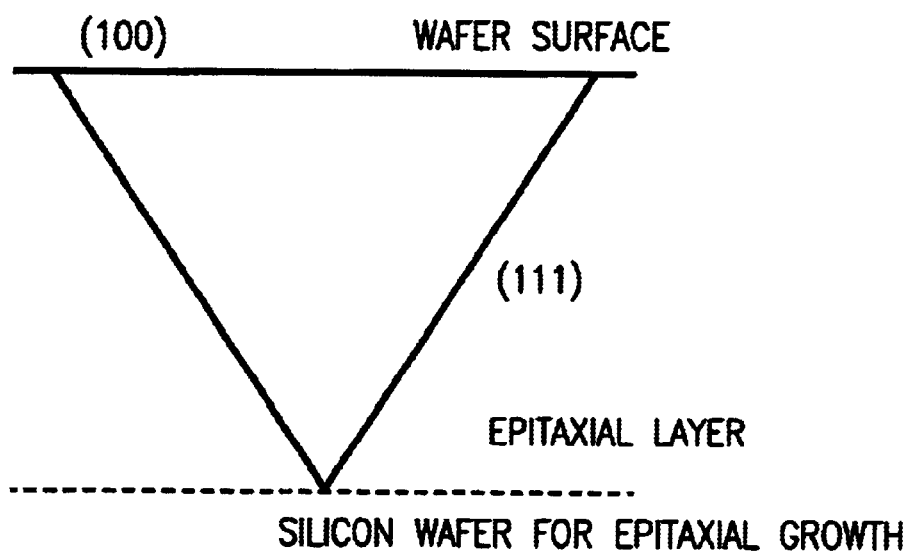
Figure 2A:
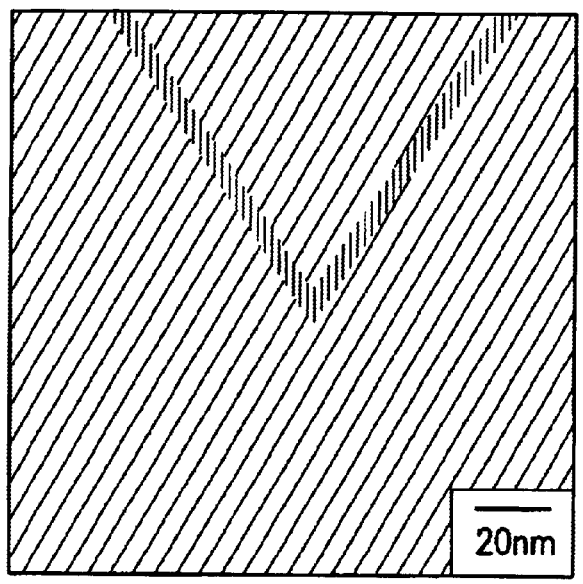
FIG. 2 is an enlarged view showing a result of cross-sectional TEM observation as for the wafer in which nitrogen is not doped, (a) is a microscope observation view and (b) is a schematic view based on the microscope observation view.
Figure 2B:
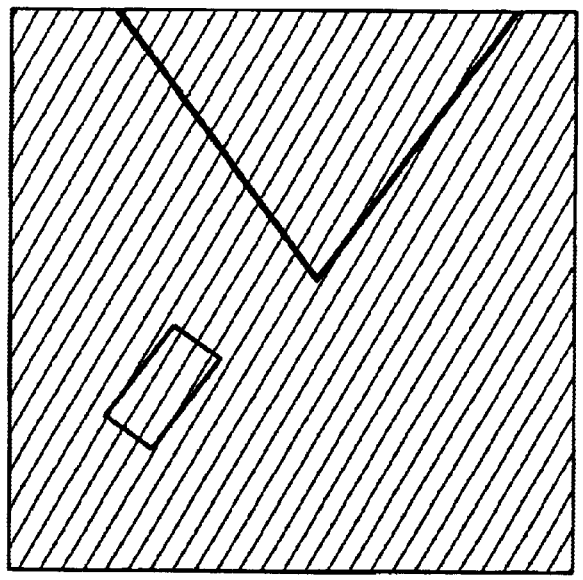
Figure 3A:
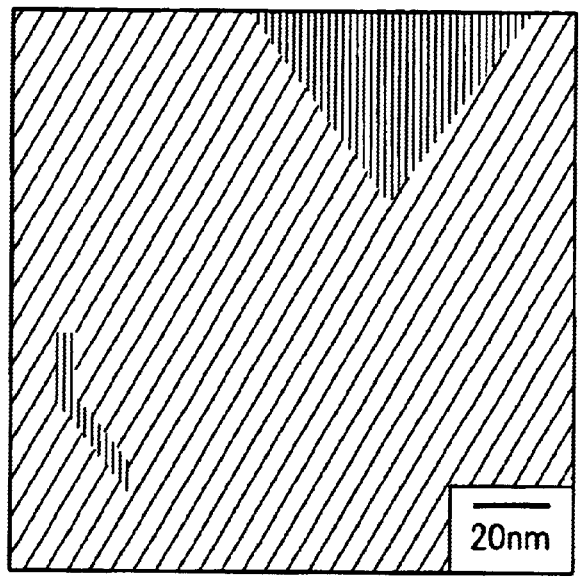
FIG. 3 is an enlarged view showing an another result of cross-sectional TEM observation as for the wafer in which nitrogen is not doped, (a) is a microscope observation view and (b) is a schematic view based on the microscope observation view.
Figure 3B:
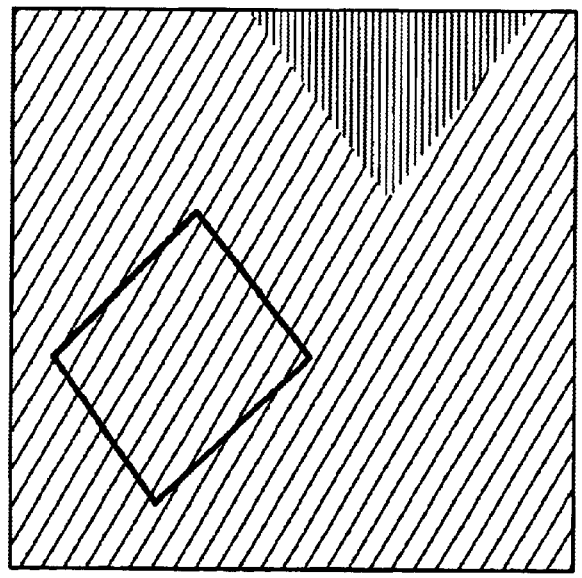
Figure 4A:
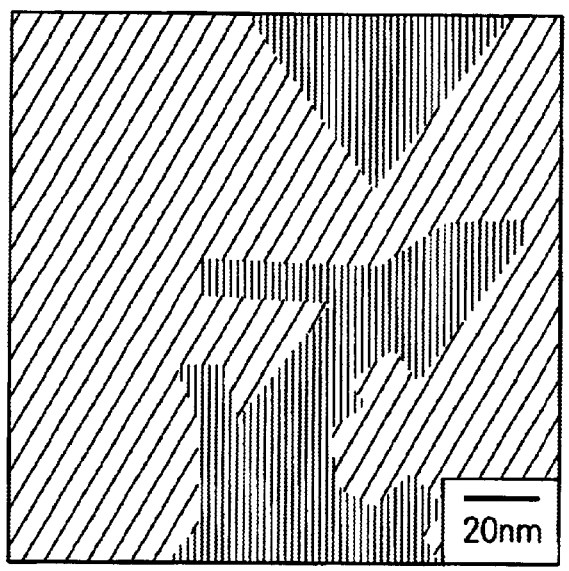
FIG. 4 is an enlarged view showing an another result of cross-sectional TEM observation as for the wafer in which nitrogen is not doped, (a) is a microscope observation view and (b) is a schematic view based on the microscope observation view.
Figure 4B:
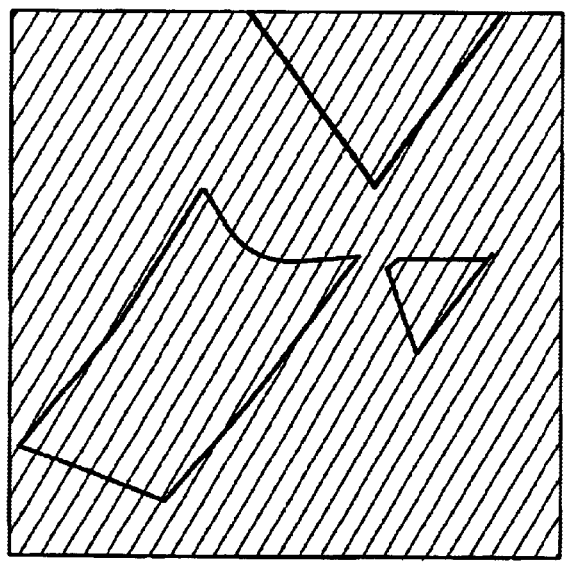

As for the SF on the surface of these epitaxial layers, cross-sectional TEM (transmission electron microscope) observation was performed from an orientation of <110> as shown in FIGS. 1(a) and (b). FIG. 1(a) is a microscope observation view, FIG. 1(b) is a schematic view showing the defects based on the microscope observation view. As for each of three of SF existing in the wafer, a portion surrounded with the ellipse in FIG. 1(a) was enlarged and observed. The results were shown in FIGS. 2(a), (b) to FIGS. 4(a) and (b). In the same way as FIG. 1, FIG. 2(a) to FIG. 4(a) are microscope observation views, and FIG. 2(b) to FIG. 4(b) are schematic views showing the defects based on the microscope observation view. In any cases, it was revealed that certain crystal defects exist under the peak of SF.

EDX analysis (Energy Dispersive X-ray spectroscopy) showed that these were all octahedral voids having an inner wall oxide film. Moreover, it was revealed that there generates SF with a peak at the position about 10 nm in the height direction and about 20–40 nm in the transverse direction apart from the octahedral voids.

Experiment 2

The Case that a Nitrogen Doped Wafer was Used as a Substrate.

Using the same substrates as Experiment 1 except that nitrogen was doped at high concentration ($3 \times 10^{14}$ number/$cm^3$), the epitaxial wafers were produced and the same investigation as for SF as Experiment 1 was conducted.

Figure 5:
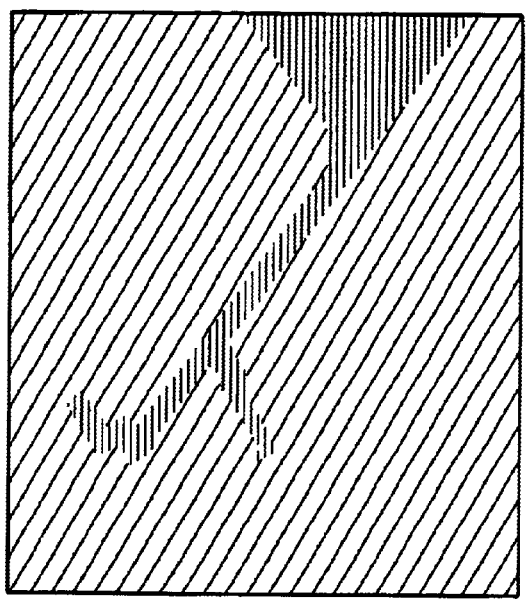
FIG. 5 is an enlarged view showing a result of cross-sectional TEM observation as for the wafer in which nitrogen is doped.
Figure 6:
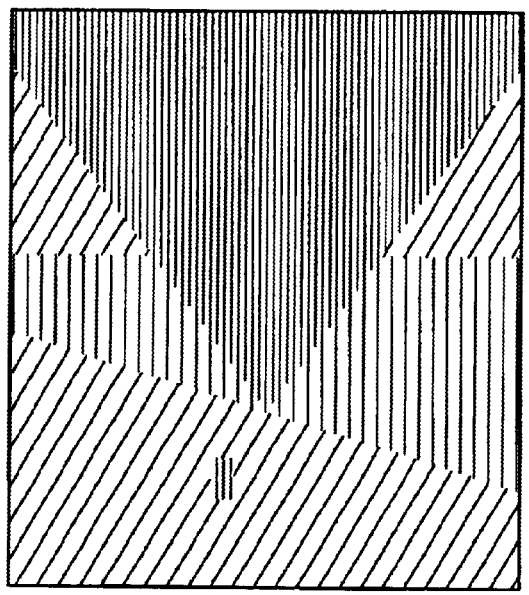
FIG. 6 is an enlarged view showing an another result of cross-sectional TEM observation as for the wafer in which nitrogen is doped.
Figure 7:
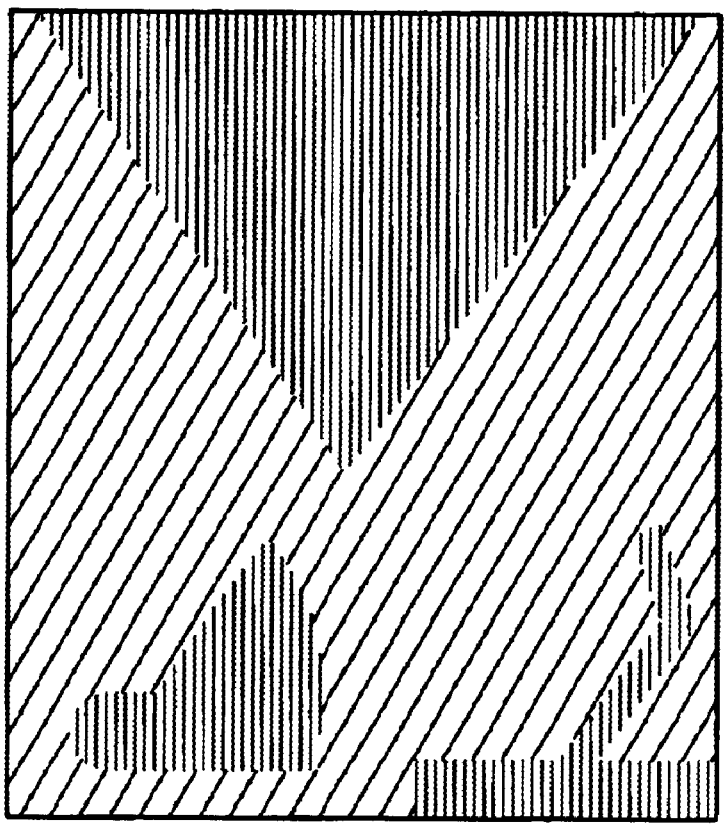
FIG. 7 is an enlarged view showing an another result of cross-sectional TEM observation as for the wafer in which nitrogen is doped.

As a result, several numbers of SF per 8 inch wafer existed on the surface of the each epitaxial layer. As for each of three SF among them, cross-sectional TEM (transmission electron microscope) observation was performed from a direction of <110> in the same way as Experiment 1. Results were shown in FIG. 5 to FIG. 7. The cross-sectional TEM observation revealed that voids in the shape of a rod or a plate peculiar to a nitrogen doped wafer just under SF were observed at the position of about 10–40 nm apart from the peak of SF as in the case of a nitrogen non-doped wafer.

According to the results of Experiment 1 and Experiment 2, it is clear that the void type defect near the wafer surface is involved in generation of SF in an epitaxial layer, which is differently from the conventional theory. Namely, it has been revealed that generation of SF can be reduced if voids do not exist near the surface of a wafer.

The mechanism of generation of SF from the void type defects can be considered as follows.

Figure 8A:
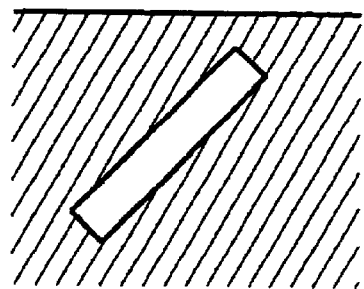
FIGS. 8(a)–(d) is an explanatory view showing formation of SF as for the wafer in which nitrogen is doped.
Figure 8B:
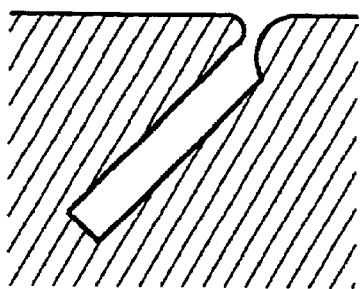
Figure 8C:
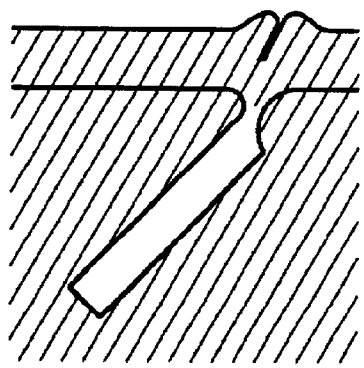
Figure 8D:
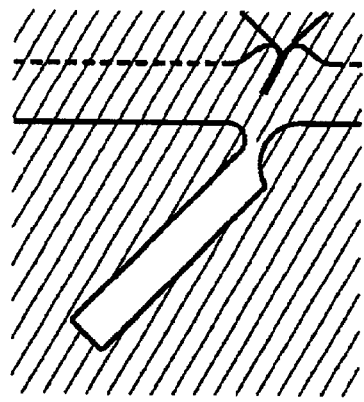

In the case of a nitrogen doped wafer, voids have the shape of a rod or a plate, and have a plate-like cut end with a size of about 20 nm×150 nm (FIG. 8(a)). Accordingly, probability that voids are exposed to the surface and form pits by etching immediately after hydrogen baking before epitaxial growth is comparatively high (FIG. 8(b)). If epi-growth is performed in this state, a pit will be closed by epi-growth from a pit end (FIG. 8(c)). It is considered that mismatching may occur at that time and pits will be SF in the subsequent epi-growth (FIG. 8(d)).

Figure 9A:
FIGS. 9(a)–(d) is an explanatory view showing formation of SF as for the wafer in which nitrogen is not doped.
Figure 9B:
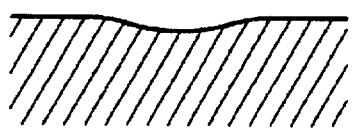
Figure 9C:
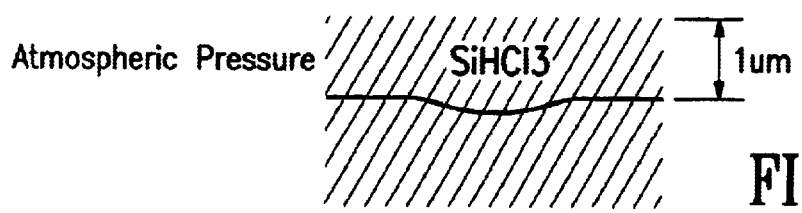

On the other hand, it is known, in the case of a nitrogen non doped wafer, that the void type defects having the opening exposed to the wafer surface comparatively greatly (FIG. 9(a)) become roundish, broad and shallow pits in hydrogen baking before the epi-layer growth in an epitaxial process (FIG. 9(b)), and thus, COP cannot disappear easily under the significantly isotropic conditions (for example, reduced pressure epi-growth using $SiH_2Cl_2$ as a raw material), but COP will disappear if an about 0.4 μm epi-layer is formed by growth under the significantly anisotropic conditions (for example, atmospheric pressure epi-growth using $SiHCl_3$ as raw materials) (FIG. 9(c)) (Kimura et al., Journal of the Japanese Association for Crystal Growth 24 (1997) 444).

Figure 9D:
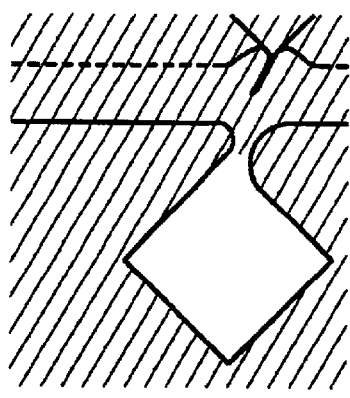

However, in the case of octahedral voids existing in a nitrogen non-doped wafer, the size of a cut end changes depending on the depth. Accordingly, when an octopus pot—like pits having a cut end with a size equivalent to those of rod or plate-like voids are formed before epitaxial growth immediately after hydrogen baking, it is thought that SF occurs therefrom (FIG. 9(d)).

Moreover, in any of void type defects of a nitrogen doped and a non-doped wafer, the peak of generated SF is at least 10 nm apart from the void type defect. Therefore, in order to surely prevent generation of SF, it is thought to be desirable that the void type defect does not exist in the part to the depth of 10 nm from the surface just before an epitaxial layer is grown.

According to the study of the inventors of the present invention described above, it has become clear that the void type defects existing near the surface of the wafer for epitaxial growth are participating in generation of SF in an epitaxial layer. Accordingly, it is necessary that the void type defects do not exist near the surface of the wafer for epitaxial growth in order to prevent SF generation.

In addition, "the void type defect is not exposed", or "the void type defect does not exist" in the present invention means that the void type defect which serves as a generation source of SF at the time of epitaxial growth is not exposed or does not exist.

Therefore, whether such a void type defect which serves as the generation source of SF exists near the surface of the wafer for epitaxial growth produced with a certain manufacture condition or not can be judged by a method comprising growing an epitaxial layer on other wafers produced with the same condition as the above manufacture conditions, and observing LPD on the surface with the optical microscope, the electron microscope, or the like.

In order to actually manufacture an epitaxial wafer which does not have SF, there can be two kinds of the methods as follows.

One is a method wherein a defect free wafer which has not been conventionally used as a wafer for epitaxial growth wherein void type defects do not originally exist in the whole wafer is used as a wafer for epitaxial growth, and an epitaxial layer is grown on the surface of the wafer. For example, FZ wafer can be used as such a defect free wafer. Even if CZ wafer is used, a defect free wafer can be obtained by controlling the conditions for pulling a crystal. Accordingly, it is also applicable for such a defect-free wafer.

Another method is a method wherein CZ wafer produced under a usual condition that contains void type defects existing on the wafer surface and in the bulk part is used, and subjected to heat treatment to eliminate the void type defects or making the void type defects into the form which does not serve as a source of SF generation, and then epitaxial growth is performed.

The present invention has been completed by study various conditions based on the above idea.

An example of the operation flow of the present invention will be shown below, but the present invention is not limited thereto.

In order to produce an epitaxial silicon wafer of the present invention, there is produced a wafer wherein the void type defect does not exist in the whole wafer, or the wafer wherein the void type defect is not exposed at least on the surface where an epitaxial layer is grown, as a silicon wafer for epitaxial growth.

As the wafer wherein the void type defect does not exist in the whole wafer, there are FZ wafer, defect free CZ wafer (wafer having no grown-in defects) produced by a method of pulling a crystal controlling V/G (V: a pulling rate, G: temperature gradient of solid-liquid interface of a crystal) while the CZ crystal is pulled, and under the condition that a vacancy cluster and a dislocation cluster are eliminated.

Such a FZ wafer is mainly used in a discrete device, and is not used as a substrate for epitaxial growth for fabrication of so-called integrated circuit, which is an object of the present invention. Moreover, the above-mentioned defect free CZ wafer was developed as a substrate that can be obtained at low cost and has characteristics equivalent to the epitaxial wafer, and thus conventionally there was no thought of forming an epitaxial layer on the wafer to be used.

However, generation of SF can be prevented by using such a wafer as a silicon wafer for epitaxial growth.

Moreover, since a shape of voids (size and form) in CZ wafer varies depending on the condition of pulling crystal, or on whether nitrogen doping is conducted or not, a failure wafer can be reduced by taking out one or more wafers from the wafers produced on a specific manufacture condition, measuring the number of the void type defects exposed to the wafer surface and/or the number of the void type defects which exist in the part to the depth of at least 10 nm from the surface of the wafer, choosing the silicon wafer wherein the void type defects are less than the predetermined values, namely the wafer satisfying the number of the void type defects predetermined so as to be permitted from the specification of an epitaxial wafer required by the user (maximum value of the number of SF), and growing an epitaxial layer thereon. Furthermore, and feed back to the manufacture conditions of a silicon single crystal wafer suitable for the epitaxial wafers is made possible, since the relation between manufacture condition (condition for pulling single crystal) and SF generation in an epitaxial layer is made clear.

As for the void type defect exposed to the wafer surface, it is possible at present to measure a void type defect with a size of about 0.08 to 0.1 μm with the above-mentioned surface inspection equipment wherein laser light is used. As for the void type defects which exist in the part to the depth of at least 10 nm from the surface of the wafer, measurement can be conducted after forming an oxide film with a thickness of about 20 nm by thermal oxidation of the wafer to be measured, and then removing the oxide film by etching.

On the other hand, voids surely exists to some extent in the surface and the bulk part of the wafer produced from CZ single crystal pulled at the usual CZ pulling rate (about 1 mm/min), without limiting a manufacture condition of CZ single crystal as described above. However, such a wafer having void type defects can be made a wafer wherein voids are not exposed on the surface at least just before growing epitaxial layer, and further it can be made a wafer wherein voids do not exist in the part to the depth of at least 10 nm from the surface of the wafer, by conducting heat treatment.

The heat treatment condition can be set up by determining experimentally the relation between a shape of pit and generation of SF, since the exposed shape of the voids (pits) that are exposed to the surface of the wafer should become the pit of gently-sloping form that does not serve as a generation source of SF when an epitaxial layer is formed after heat treatment.

Moreover, the suitable heat treatment which can eliminate the void type defects that are not exposed to the wafer surface depends on the shape and the size of the void which exist in a wafer. Accordingly, suitable condition for the heat treatment can be set up experimentally in consideration of the manufacture conditions (pulling conditions of a single crystal etc.) of a wafer to be subjected to heat treatment. The heat treatment furnace for conducting these heat treatment is not limited. Example thereof include: a heater heating type batch furnace, a lamp heating type RTA (Rapid Thermal Anneal) furnace or the like. Moreover, these heat treatment can also be incorporated into an epitaxial process using epitaxial growth equipment.

Specific heat treatment can be as follows. Since the natural oxide film is usually formed on the surface of the wafer to be subjected heat treatment, it is first subjected to the first heat treatment, in non-oxidizing atmosphere, preferably in an atmosphere containing hydrogen at 1100° C. to 1300° C. to remove a surface natural oxide film, and to remove the inner wall oxide film of the void type defect by out-diffusion. Heat treatment at a temperature less than 1100° C., removal of a surface natural oxide film and out diffusion of an inner wall oxide film is apt to be insufficient. Removal of a surface natural oxide film can be performed in a short time, and thus atmosphere is changed to the gas which does not have the etching action to the substrate, such as argon, immediately after it, and out-diffusion of an inner wall oxide film can be conducted continuously. Thereby, voids (pits) exposed to the surface becomes smooth by migration of a surface silicon atom, and an inner wall oxide film of internal voids is removed, so that it may easily receive the interstitial silicon.

Next, heat treatment at a temperature of 700–1300° C. in oxidizing atmosphere is conducted as the second heat treatment. Thereby, a thermal oxide film is formed on the surface, and thus a form of pits on the surface becomes further smoother. Moreover, since the interstitial silicon is injected into the inside of a wafer with advance of oxidation, it is efficiently injected into voids wherein the inner wall oxide film had been removed by the first heat treatment, and voids are filled. If the heat treatment is conducted at 700° C. or higher, interstitial silicon sufficient for elimination of the voids can be injected. In addition, once it is cooled at temperature lower than 700° C. after the first heat treatment, an inner wall oxide film will be grown again, and therefore, it is preferable that the first heat treatment and the second heat treatment are conducted continuously, without cooling at a temperature lower than 700° C. The oxide film on the surface of the wafer formed by the heat treatment is removed with an aqueous solution of hydrofluoric acid, and then subjected to epitaxial growth.

Moreover, in heat-treating using epitaxial growth equipment, a surface natural oxide film is removed by hydrogen baking before the epitaxial layer growth in an epitaxial process, then atmosphere gas is changed to inert gas, such as argon, and heat treatment is conducted with introducing inert gas to out-diffuse the inner wall oxide film of the void type defect which are not exposed to the the surface of the wafer effectively. Thereby, voids can be eliminated by migration of a silicon atom.

In this case, the atmosphere in which the heat treatment is conducted after hydrogen baking does not have to be the atmosphere 100% replaced by inert gas 100%, nor an atmosphere wherein the ratio of inert gas and hydrogen are fixed to the certain value. Inert gas and hydrogen gas may be mixed and the heat treatment can be conducted in the state that the ratio changes with time. When argon is introduced as inert gas, the ratio of Ar and hydrogen gas is preferably about 3:1.

If epitaxial growth is performed by the generally conducted method wherein the wafer subjected to the above heat treatment is used as a substrate, the epitaxial wafer wherein generation of SF is significantly suppressed can be obtained.

The wafer in which nitrogen is doped is preferably used as a substrate from the point of gettering effect of the epitaxial wafer or the like, both in the case that the silicon wafer for epitaxial growth that originally contains no void type defect is produced and the case that the void type defects are eliminated by the later heat treatment. Silicon single crystal in which nitrogen is doped can be produced by a well-known method.

Namely, if a silicon single crystal ingot is grown, for example by the CZ method, nitrogen can be doped during pulling a crystal by putting nitride in a quartz crucible in advance, putting a nitride into a silicon melt, using atmosphere gas containing nitrogen, or the like. In that case, the doping amount in the crystal can be controlled by adjusting an amount of a nitride, or concentration or introducing time of nitrogen gas or the like.

The present invention will be specifically explained hereunder by the following example and the comparative example. The example is not intended to limit the scope of the present invention.

EXAMPLE 1 polycrystal silicon as a raw material was charged into 18 inch quartz crucible, and a silicon single crystal ingot having a diameter of 6 inches, conductivity type of p type, orientation <100> was pulled. Rotation rate of crucible was set to 4 rpm, and a crystal rotation rate was set to 15 rpm. The silicon single crystal was pulled, with controlling a pulling rate to be in the range of 0.54 to 0.52 mm/min, so that V/G (V:pulling rate, G: temperature gradient at a solid-liquid interface of the crystal) may be 0.152–0.146 mm$^2$/° C. min. The wafers were cut out from the silicon single crystal ingot thus obtained, and four silicon wafers for epitaxial growth were produced.

About 4 μm epitaxial layer was formed on the surface of the silicon wafer for epitaxial growth to produce four epitaxial wafers. They were subjected to preferential etching and optical microscope observation of the LPD on the surface of epitaxial layer detected with the surface inspection equipment (manufactured by KLA-Tencor Corporation, Surf Scan 6200) using laser light. SF was not observed all over the surface in any of the epitaxial wafers.

EXAMPLE 2

The silicon single crystal was pulled at the usual pulling rate (about 1 mm/min) with doping nitrogen to produce a CZ silicon single crystal wafer (a crystal axis orientation <100>, p type, 10-Ωcm, oxygen concentration 15 ppma (JEIDA standard)) with a diameter of 8 inches and nitrogen concentration of $1 \times 10^{14}$ number/cm.

Then, these silicon wafers were subjected to heat treatment at a temperature of 1200° C. in argon atmosphere is conducted in the heater heating type batch furnace for one hour, then heat treatment at a temperature of 1200° C. in oxygen atmosphere for 10 minutes is conducted continuously, without taking out wafers from a furnace and without cooling at temperature of 800° C. or lower. After the heat treatment, the surface oxide film was removed and the void type defect of the surface of the silicon wafer was observed. No void type defect was found on the wafer surface of any of the wafers.

Four epitaxial wafers were produced by forming an about 4 μm epitaxial layer on the surface of the silicon wafer for epitaxial growth, and LPD on the surface of epitaxial layer was observed with the optical microscope by the similar method to Example 1. SF was not observed all over the surface in any of the epitaxial wafers.

COMPARATIVE EXAMPLE

The silicon single crystal was pulled at the usual pulling rate (about 1 mm/min) according to the same method as Example 2 except that nitrogen was not doped, to produce four CZ silicon single crystal wafers (a crystal axis orientation <100>, p type, 10-Ωcm, oxygen concentration 15 ppma (JEIDA standard)) with a diameter of 8 inches were produced.

Four epitaxial wafers were produced by directly forming about 4 μm epitaxial layer on the surface of this silicon wafer for epitaxial growth, without conducting heat treatment, and LPD on the surface of epitaxial layer was observed with the optical microscope. As a result, about two SF on average existed on the epitaxial layer surface per 8 inch wafer.

The present invention is not limited to the above-described embodiment. The above-described embodiment is a mere example, and those having the substantially same structure as that described in the appended claims and providing the similar action and effects are included in the scope of the present invention.

What is claimed is:

1. A silicon wafer for epitaxial growth wherein a void defect is not exposed at least on a surface where an epitaxial layer is grown.

2. The silicon wafer for epitaxial growth according to claim 1 wherein the void defect does not exist in the part to the depth of at least 10 nm from the surface on which an epitaxial layer is grown.

3. The silicon wafer for epitaxial growth according to claim 2 wherein nitrogen is doped in the silicon wafer for epitaxial growth.

4. An epitaxial wafer wherein an epitaxial layer is formed on the surface of the silicon wafer for epitaxial growth according to claim 3.

5. An epitaxial wafer wherein an epitaxial layer is formed on the surface of the silicon wafer for epitaxial growth according to claim 2.

6. The silicon wafer for epitaxial growth according to claim 1, wherein nitrogen is doped in the silicon wafer for epitaxial growth.

7. An epitaxial wafer wherein an epitaxial layer is formed on the surface of the silicon wafer for epitaxial growth according to claim 6.

8. An epitaxial wafer wherein an epitaxial layer is formed on the surface of the silicon wafer for epitaxial growth according to claim 1.

9. A method for producing an epitaxial wafer comprising measuring at least one of the number of the void defects exposed on the surface of a silicon wafer and the number of the void defects which exist in the part to the depth of at least 10 nm from the surface of the silicon wafer, choosing the silicon wafer wherein the number of these void defects is smaller than a given value, and growing an epitaxial layer on the surface of the chosen silicon wafer.

10. The method for producing an epitaxial wafer according to claim 9 wherein a silicon wafer in which nitrogen is doped is used as the silicon wafer.

11. A method for producing an epitaxial wafer wherein a silicon wafer having at least one of void defects exposed to the surface and void defects in the part to the depth of at least 10 nm from the surface is subjected to heat treatment so that the above-mentioned void defects may be eliminated or made into a form that does not become a generation source of SF, and an epitaxial layer is grown on the above-mentioned silicon wafer surface.

12. The method for producing an epitaxial wafer according to claim 11 wherein the heat treatment is conducted at a temperature of 1100–1300° C. in non-oxidizing atmosphere as the above-mentioned heat treatment, and then, heat treatment at a temperature of 700–1300° C. in oxidizing atmosphere is continuously conducted, without cooling to a temperature less than 700° C.

13. The method for producing an epitaxial wafer according to claim 12 wherein a silicon wafer in which nitrogen is doped is used as the silicon wafer.

14. The method for producing an epitaxial wafer according to claim 11 wherein the heat treatment is also performed with introducing inert gas after hydrogen baking before growing an epitaxial layer in an epitaxial process.

15. The method for producing an epitaxial wafer according to claim 14 wherein a silicon wafer in which nitrogen is doped is used as the silicon wafer.

16. The method for producing an epitaxial wafer according to claim 11 wherein a silicon wafer in which nitrogen is doped is used as the silicon wafer.

* * * * *